United States Patent
Kamano et al.

(10) Patent No.: US 7,148,676 B2
(45) Date of Patent: Dec. 12, 2006

(54) ANCILLARY EQUIPMENT FOR TESTING SEMICONDUCTOR INTEGRATED CIRCUIT

(75) Inventors: Satoru Kamano, Katano (JP); Tomohiko Kanemitsu, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/726,891

(22) Filed: Dec. 4, 2003

(65) Prior Publication Data

US 2004/0257066 A1 Dec. 23, 2004

(30) Foreign Application Priority Data

Jun. 18, 2003 (JP) ............................ 2003-172698

(51) Int. Cl.
*G01R 31/28* (2006.01)

(52) U.S. Cl. .................................. 324/158.1

(58) Field of Classification Search ................ 324/765, 324/763, 760, 158.1; 714/734, 736, 731; 702/118
See application file for complete search history.

(56) References Cited

U.S. PATENT DOCUMENTS

| | | | | |
|---|---|---|---|---|
| 3,733,587 A | | 5/1973 | Lloyd et al. ............. 340/172.5 |
| 3,764,995 A | | 10/1973 | Helf, Jr. et al. .......... 340/172.5 |
| 4,467,275 A | * | 8/1984 | Maeda et al. ................ 324/713 |
| 5,931,962 A | * | 8/1999 | Dang .......................... 714/731 |
| 6,255,843 B1 | * | 7/2001 | Kurihara ..................... 324/765 |
| 6,349,392 B1 | * | 2/2002 | Swoboda et al. ............. 714/30 |
| 6,456,102 B1 | * | 9/2002 | Mori et al. .................. 324/765 |
| 6,628,137 B1 | * | 9/2003 | Mori et al. .................. 324/765 |
| 2002/0118017 A1 | | 8/2002 | Mori et al. .................. 324/465 |

* cited by examiner

*Primary Examiner*—Ha Tran Nguyen
*Assistant Examiner*—Tung X. Nguyen
(74) *Attorney, Agent, or Firm*—Steptoe & Johnson LLP

(57) ABSTRACT

An ancillary equipment is provided for testing a semiconductor integrated circuit, by which a plurality of BOST boards serving as measuring units can be set near a device to be measured and tests can be conducted with high accuracy on a number of circuits embedded on a semiconductor integrated circuit such as a system LSI. To achieve an object of performing a go/no go test or a functional/performance characterization in the manufacturing process of the semiconductor integrated circuit, the ancillary equipment includes: a device measuring unit having a measuring section for exchanging a signal with a device or a semiconductor integrated circuit, and an analyzing section for analyzing information from the measuring section using a programmable device; and a control/communication card constituted of a board different from that of the device measuring unit and connected to the device measuring unit to control it, and being capable of performing communication with a general-purpose computer.

13 Claims, 2 Drawing Sheets

ANCILLARY EQUIPMENT FOR TESTING SEMICONDUCTOR INTEGRATED CIRCUIT

FIELD OF THE INVENTION

The present invention relates to an ancillary equipment for testing a semiconductor integrated circuit, by which a semiconductor integrated circuit such as a system LSI is tested.

BACKGROUND OF THE INVENTION

In recent years system LSIs having a plurality of circuits embedded therein have been developed rapidly and various apparatuses and methods have been proposed to test such system LSIs.

Tester manufacturers have proposed mixed-signal testers as testers for semiconductor integrated circuits that are provided only for testing system LSIs. Such testers for semiconductor integrated circuits are quite expensive.

For lower cost and higher accuracy, Japanese Patent Laid-Open No. 2002-236150 proposes a device measuring unit (external ancillary equipment for test: Built Off Self Test (hereinafter, referred to as a BOST unit)). Further, a method is proposed to control and test a BOST unit by using a general-purpose personal computer (PC), which is general-purpose computer, a general-purpose EWS (work station), a communication card, and a communication mode converting module instead of an inexpensive tester.

FIG. 2 is a diagram schematically showing the configuration of this kind of conventional ancillary equipment for testing a semiconductor integrated circuit and a testing method. In the conventional ancillary equipment for testing a semiconductor integrated circuit, general-purpose computer constituted of a general-purpose PC or a general-purpose EWS is used as a controller 22 of a BOST unit 21. The controller 22 and the BOST unit 21 are connected to each other via a communication line 23 of typical communication modes of USB, RS232C, IEEE1394, GPIB, LAN, and so on. As an interface on the BOST unit 21, a communication card 24 is provided for each of the communication modes. The BOST unit 21 comprises one or more slots for mounting the plurality of communication cards 24 in a sharing manner and a communication mode converting module 25 for conversion into a dedicated bus mode for the BOST unit 21.

Moreover, a BOST board 26 provided in the BOST unit 21 is constituted of an ADC/DAC measuring section 27, a measurement data memory 28, an analyzing section 29, a control section 30, and a power supply 31. The ADC/DAC measuring section 27 is constituted of a data circuit for generating a digital test signal and supplying the signal to a DA converter of a semiconductor integrated circuit, which is a device to be measured, a testing digital to analog converter (DAC) for converting a digital test signal from the data circuit into an analog test signal and supplying the signal to an AD converter of the device to be measured, and a testing analog to digital converter (ADC) for converting analog test output from the DA converter of the device to be measured into digital test output. The measurement data memory 28 stores digital test output from the AD converter of the device to be measured and digital test output from the testing AD converter. The analyzing section 29 analyzes the digital test outputs stored in the measurement data memory 28 and transmits the analysis result to the general-purpose computer 22 of controller 22.

However, in the conventional ancillary equipment for testing a semiconductor integrated circuit, the BOST unit 21 serving as a device measuring unit includes the communication interface cards 24, the communication mode converting module 25, and the control section 30 as well as the ADC/DAC measuring section 27 and the analyzing section 29. Thus, the BOST unit 21 is increased in size and is not suitable as a test board having a large number of external components with a small space. Further, it is difficult to dispose two or more BOST units 21 near a device to be measured.

In the near future, tests will be necessary for semiconductor integrated circuits such as a system LSI combining more kinds of circuits, and thus higher accuracy and lower cost are demanded. In order to accurately test a number of semiconductor integrated circuits, it is necessary to dispose two or more BOST units 21, each having a measuring section suitable for each semiconductor integrated circuit, near the semiconductor integrated circuit serving as a device to be measured.

DISCLOSURE OF THE INVENTION

The present invention is devised to solve the conventional problem and has an object to provide an ancillary equipment for testing a semiconductor integrated circuit that permits a plurality of BOST boards serving as device measuring units to be set near a device to be measured and can accurately test a number of circuits embedded on a semiconductor integrated circuit such as a system LSI.

An ancillary equipment for testing a semiconductor integrated circuit according to the first aspect of the present invention comprises a device measuring unit, which is constituted of a measuring section and an analyzing section, and a control/communication card which is constituted of a board different from that of the device measuring unit, connected to the device measuring unit to control the device measuring unit, and carries out communication with general-purpose computer. The measuring section exchanges a signal with a device to be measured which comprises a semiconductor integrated circuit, in order to conduct a go/no go test or a functional/performance characterization in the manufacturing process of the semiconductor integrated circuit, and the analyzing section analyzes information from the measuring section by using a programmable device.

With this configuration, the cost can be reduced by using inexpensive general-purpose computer, control/communication card, and device measuring unit instead of using an expensive tester provided by a tester manufacturer.

According to the second aspect of the present invention, the control/communication card has a data input section for acquiring data from the device measuring unit, a control signal output section for transmitting a control signal to the device measuring unit, and an interface for exchanging a signal with the general-purpose computer.

With this configuration, since the control/communication card comprises the data input section, the control signal output section, and the interface, it is possible to minimize the number of components mounted on the device measuring unit with a small size and permit the general-purpose computer to readily handle a plurality of device measuring units.

According to the third aspect of the present invention, the device measuring unit has a program writing port and a program can be written on the programmable device of the device measuring unit from the general-purpose computer.

With this configuration, a program used for a test can be readily downloaded at any time from the general-purpose computer to the device measuring unit and hardware such as a ROM needs not be replaced at all. Hence, the device measuring unit can be debugged efficiently. Further, by rewriting the contents of the programmable device on the device measuring unit, it is possible to measure various kinds of devices without changing the hardware and to achieve flexibility in use of the ancillary equipment.

According to the fourth aspect of the present invention, the device measuring unit or the control/communication card comprises an observing terminal for observing an input/output signal and an internal signal of the device measuring unit.

With this configuration, the observing terminal makes it possible to confirm a signal inputted and outputted from the device measuring unit and an operation performed inside the device to be measured.

According to the fifth aspect of the present invention, the device measuring unit comprises a connector for making connection via a cable with a substrate having a socket for mounting thereon with a device to be measured, and a connector for directly making insertion into the substrate.

With this configuration, it is possible to make connection suitable for the substrate mounted thereon with the device.

According to the sixth aspect of the present invention, the device measuring unit comprises a plurality of input terminals for inputting signals from a plurality of circuits provided on the device, and an input signal selector for selecting signals from the plurality of input terminals and switching the signals.

With this configuration, processing can be performed while selection and switching are performed on signals from the plurality of circuits embedded on the device, thereby handling tests on a plurality of circuits.

According to the seventh aspect of the present invention, the control/communication card comprises a device measuring unit diagnosing unit which transmits a diagnostic signal for diagnosing the device measuring unit to the device measuring unit and transfers diagnostic result data from the device measuring unit to the general-purpose computer.

With this configuration, the control/communication card transmits a diagnostic signal to the device measuring unit, and the device measuring unit performs self-diagnosis based on the diagnostic signal transmitted from the control/communication card and sends the result back to the control/communication card. In this way, the device measuring unit can be self-diagnosed.

According to the eighth aspect of the present invention, a plurality of device measuring units are provided and a test can be conducted using one or more of the device measuring units.

With this configuration, when tests are conducted on a plurality of circuits (e.g., ADC circuit, DAC circuit) which differ in characteristics from each other and are included in the device, the tests can be conducted by using the device measuring unit having the measuring section suitable for the characteristic of each circuit. Further, since the device measuring unit has a small size, two or more device measuring units can be set around the device.

According to the ninth aspect of the present invention, the programmable device of the device measuring unit is a Flash-ROM.

According to the tenth aspect of the present invention, a socket capable of mounting thereon with the device is provided in the device measuring unit.

With this configuration, measurements can be made also by directly mounting the device in the device measuring unit.

Thus, according to the present invention, the device measuring unit such as the BOST board has minimum required functions (analyzing section and measuring section) and the control/communication card has the other functions. Hence, the device measuring unit can be reduced in size, and when tests are conducted on a number of circuits embedded on the device, tests can be conducted while two or more small device measuring units are set around the device without restrictions on its location, the device measuring unit having the measuring section suitable for a characteristic of each circuit. Since the wiring distance of an analog signal can be minimized in the device and all the device measuring units, tests can be conducted with high accuracy.

Further, since the general-purpose computer such as a general-purpose PC/EWS is used to control the device measuring unit, the cost can be lower than those of testers (mixed signal tester) for semiconductor integrated circuits that are provided by tester manufacturers. Moreover, since the program of the analyzing section of the device measuring unit can be readily rewritten from the general-purpose computer, debugging and flexibility are improved.

DESCRIPTION OF THE EMBODIMENT

Figure 1:
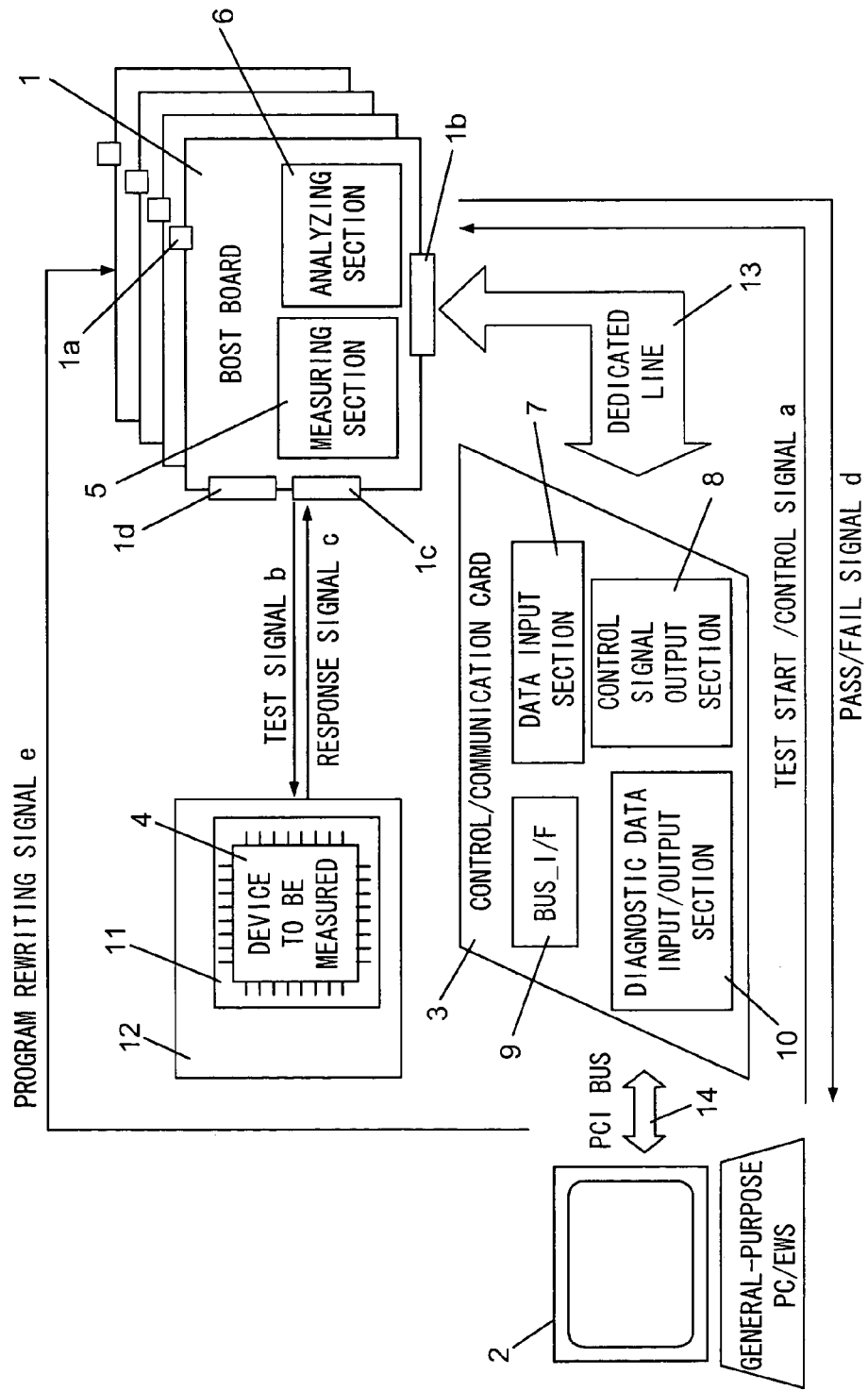
FIG. 1 is a diagram schematically showing an ancillary equipment for testing a semiconductor integrated circuit according to an embodiment of the present invention.
Figure 2:
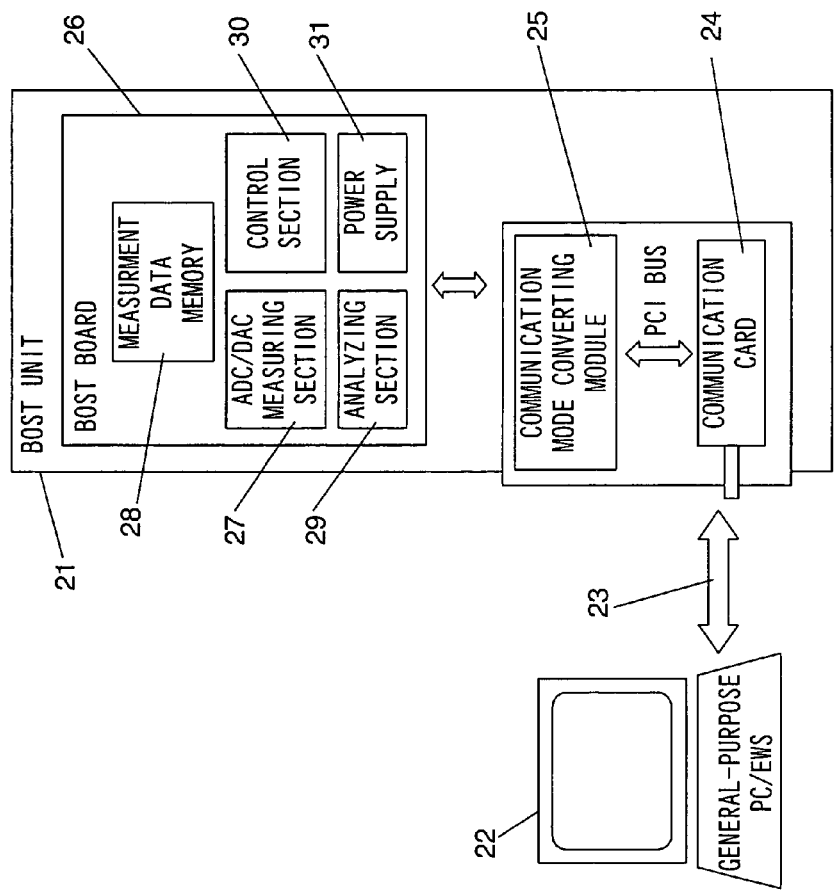
FIG. 2 is a diagram schematically showing a conventional ancillary equipment for testing a semiconductor integrated circuit.

Referring to FIG. 1, the following will describe an embodiment of the present invention.

FIG. 1 is a diagram schematically showing the configuration of an ancillary equipment for testing a semiconductor integrated circuit according to the embodiment of the present invention. As shown in FIG. 1, the ancillary equipment for testing a semiconductor integrated circuit comprises BOST boards 1 serving as device measuring units and a control/communication card 3. The control/communication card 3 is constituted of a board different from the BOST board 1, is connected to the BOST board 1 to control the BOST board 1, and carries out communication with general-purpose computer 2 composed of a general-purpose PC/EWS. The BOST board 1 and the control/communication card 3 are connected via a dedicated line 13 which carries out communication only using a digital signal. Reference numeral 14 denotes a communication line of USB, RS232C, IEEE1394, GPIB, LAN, and so on that connects the general-purpose computer 2 and the control/communication card 3.

The BOST board 1 serving as a device measuring unit is constituted of a measuring section 5 and an analyzing section 6. The measuring section 5 exchanges an analog signal and a digital signal with a device to be measured 4 in order to conduct a go/no go test or a functional/performance characterization in the manufacturing process of the semiconductor integrated circuit serving as the device 4, and analyzing section 6 analyzes information from the measuring section 5 by using a programmable device. Besides, a plurality of BOST boards 1 can be used to measure a plurality of circuits having different characteristics in the device 4.

The general-purpose computer 2 transmits a test start signal and a minimum required control signal via the control/communication card 3 to the BOST board 1, and the BOST board 1 transmits a digital/analog signal for a device test to the device. The BOST board 1 decides whether or not an analog/digital signal returned from the device 4 is a normal response signal and sends a PASS/FAIL signal back to the general-purpose computer 2 via the control/communication card 3. The BOST board 1 and the control/communication card 3 are connected via the dedicated line 13 which carries out communication only using a digital signal.

The control/communication card 3 is constituted of a data input section 7 for acquiring data from the BOST board 1, a control signal output section 8 for transmitting a control signal to the BOST board 1, an interface (BUS_I/F) 9 for exchanging a signal with the general-purpose computer 2, and a diagnostic data input/output section 10 which inputs and outputs data for diagnosing the BOST board 1.

Further, the BOST board 1 comprises a Flash-ROM, in which a program for measuring the device 4 is written, and a program writing port 1a for writing the program or the like on the Flash-ROM. Thus, the program can be written on the Flash-ROM of the BOST board 1 from the general-purpose computer 2.

Moreover, for detailed characterization on the device 4 and characterization on the Flash-ROM of the BOST board 1, the BOST board 1 comprises an observing terminal 1b for observing an input/output signal and an internal signal of the BOST board 1. The observing terminal 1b may be provided on the control/communication card 3 to perform outputting via the dedicated line to the BOST board 1.

Furthermore, the BOST board 1 comprises a connector 1c for making connection via a general-purpose cable with a substrate 12 having a socket 11 for mounting the device 4, and a connector 1d for directly making insertion into the substrate 12 having the socket 11 for mounting the device 4. These connectors 1c and 1d each includes a plurality of terminals for both inputting and outputting signals from and to a plurality of circuits embedded on the device 4. Besides, the BOST board 1 has an input signal selecting function to select and switch a plurality of input signals from the plurality of input terminals provided on the connectors 1c and 1d.

The control/communication card 3 has a device measuring unit diagnosing function which supplies a diagnostic signal to the BOST board 1 and transfers diagnostic result data from the BOST board 1 to the general-purpose computer 2. Further, the BOST board 1 or the control/communication card 3 includes a clock generating section (not shown) for supplying a clock to the BOST board 1 and the control/communication card 3.

The following will describe an operational example of the ancillary equipment thus configured for a semiconductor integrated circuit.

A test start/control signal (a test start signal and a minimum required control signal) a from the general-purpose computer 2 is inputted via the BUS_I/F 9 and the control signal output section 8 of the control/communication card 3 to the BOST board 1. The BOST board 1 having received the signal a outputs a test signal (an analog or a digital signal, hereinafter referred to as an analog/digital signal) b to the device 4. A response signal (analog/digital signal) c from the device 4 is inputted to the measuring section 5 of the BOST board 1. The analyzing section 6 of the BOST board 1 analyzes whether or not the response signal c is within a predetermined accuracy range, that is, the analyzing section 6 decides whether the response signal c is normal or not. The analyzing section 6 sends a resultant PASS/FALL signal d back to the general-purpose computer 2 via the data input section 7 and the BUS_I/F 9 of the control/communication card 3.

When rewriting is required on the analyzing section 6 of the BOST board 1 during debugging and so on, a program rewriting signal e is transmitted from the general-purpose computer 2 to the analyzing section 6 of the BOST board 1, and a program is rewritten.

Further, in the present embodiment, periodic calibration is performed to diagnose (DIAG) the BOST board 1. When the BOST board 1 is diagnosed, the diagnostic data input/output section 8 for the control/communication card 3 supplies a diagnostic signal to the BOST board 1, and the BOST board 1 performs self-diagnosis based on the diagnostic program written on the Flash-ROM and the diagnostic signal transmitted from the control/communication card 3 and sends the result back to the control/communication card 3. In this way, the diagnostic signal is exchanged between the control/communication card 3 and the BOST board 1 to perform diagnosis. Hence, although a conventional technique requires both of a DA converter and an AD converter to perform self-diagnosis in an analog ancillary equipment for test, in the method of the present embodiment, it is only necessary to send self-diagnosis back from the BOST board 1 to the control/communication card 3, requiring only one of the DA converter and the AD converter.

According to the above configuration, the ancillary equipment for testing a semiconductor integrated circuit is constituted of the general-purpose computer 2, the control/communication card 3, and the BOST board 1 which has the measuring section 5 and the analyzing section 6 and serves as a device measuring unit at low cost. Thus, the cost can be reduced without using expensive testers provided by tester manufactures. Moreover, the configuration of the BOST board 1 serving as a device measuring unit only requires the analyzing section 6 constituted of the Flash-ROM (may be a programmable device other than the Flash-ROM), which is a programmable device, and the measuring section 5, thereby achieving a small size and low cost. Further, since the BOST board 1 and the control/communication card 3 carry out communication only using a digital signal and are connected via the dedicated line 13, the BOST board 1 can freely move near the device 4 without restrictions on its location, and a communication distance of an analog signal can be minimized to reduce noise, achieving higher accuracy.

Further, the control/communication card 3 is constituted of the data input section 7 for acquiring data from the BOST board 1, the control signal output section 8 for supplying a control signal to the BOST board 1, the interface (BUS_I/F) 9 for exchanging a signal with the general-purpose computer 2, and the diagnostic data input/output section 10 which inputs and outputs data for diagnosing the BOST board 1. Hence, it is possible to minimize the number of components mounted on the BOST board 1 with a small size and permit the general-purpose computer 2 to readily handle the plurality of BOST boards 1.

Besides, since a program can be written from the general-purpose computer 2 to the Flash-ROM of the BOST board 1, the program can be readily downloaded at any time from the general-purpose computer 2 used for a test and hardware such as a ROM is not replaced at all. Hence, the BOST board 1 can be debugged efficiently. The programmable device such as the Flash-ROM on the BOST board 1 can undergo rewriting as many times as needed, and all pieces of data required for a test is stored. Therefore, by rewriting the contents of the programmable device, it is possible to measure various kinds of the device 4 without changing its hardware and to flexibly use the proposed ancillary equipment.

Further, since the BOST board 1 comprises the observing terminal 1b for observing an input/output signal and an internal signal of the BOST board 1, an operation inside the unit of the BOST board 1 serving as a device measuring unit can be confirmed by using the observing terminal 1b. A signal outputted from the observing terminal 1b can be determined by writing the contents of the programmable device such as the Flash-ROM, minimizing the observing terminal 1b.

Moreover, since the BOST board 1 comprises the connector 1c for making connection with the substrate 12 via the cable and the connector 1d for directly making insertion into the substrate 12, it is possible to select a method for connecting the device 4 and the BOST board 1, and connect the BOST board 1 according to the shape of the substrate 12 having the device 4.

Further, since the BOST board 1 has an input signal selecting function of processing a plurality of input signals from the device 4, signals from the plurality of circuits embedded on the device 4 can be switched under the control of the programmable device, efficiently conducting tests on the plurality of circuits with the single BOST board 1.

Moreover, tests can be conducted using the plurality of BOST boards 1 serving as device measuring units. Hence, when tests are conducted on a plurality of circuits (ADC circuit, DAC circuit, etc.) that are included in the device 4 with different characteristics, the circuits can be tested by the BOST boards 1 each having the measuring section 5 suitable for the characteristic of the circuit. Since the BOST boards 1 are small in size, the two or more BOST boards 1 can be set around the device 4. The above embodiment described that the plurality of BOST boards 1 are controlled by the single control/communication card 3. The number of the control/communication cards 3 is not limited and thus control may be performed using two or more control/communication cards.

Further, the above embodiment described that the device 4 is mounted in the socket 11 attached onto the substrate 12. The configuration is not limited and the BOST board 1 may have a socket capable of mounting the device 4. In this case, it is possible to further shorten a communication distance of an analog signal to reduce noise, achieving higher accuracy.

What is claimed is:

1. An ancillary equipment for testing a semiconductor integrated circuit, comprising:
   a device measuring unit supported on a board and comprising a measuring section and an analyzing section, the measuring section for exchanging a signal with a device to be measured, which device comprises a semiconductor integrated circuit mounted on a device measuring unit circuit board, the analyzing section for analyzing information from the measuring section by using a programmable device; and
   a control/communication card comprising a board different from the board supporting the device measuring unit, control/communication card being connected to the device measuring unit to control the device measuring unit and for sending analyzed results back to a general-purpose computer, wherein the device measuring unit comprises one of a first connector for connection via cable to a substrate having a socket for mounting a device to be measured, or a second connector for insertion directly into the substrate.

2. The ancillary equipment according to claim 1, wherein the control/communication card comprises a data input section for acquiring data from the device measuring unit, a control signal output section for transmitting a control signal to the device measuring unit, and an interface for exchanging a signal with a general-purpose computer.

3. The ancillary equipment according to claim 1, wherein the device measuring unit comprises a program writing port to allow a program to be written on a programmable device from a general-purpose computer.

4. The ancillary equipment according to claim 1, wherein the device measuring unit or the control/communication card comprises a terminal for observing an input/output signal and an internal signal of the device measuring unit.

5. The ancillary equipment according to claim 1, wherein the device measuring unit comprises both the first connector and the second connector.

6. The ancillary equipment according to claim 1, wherein the device measuring unit comprises a plurality of input terminals for receiving signals from a plurality of circuits located on the device, and an input signal selector for selecting and switching signals from the plurality of input terminals.

7. The ancillary equipment according to claim 1, wherein the control/communication card comprises a diagnostic data input/output section for transmitting a diagnostic signal for diagnosing the device measuring unit to the device measuring unit and for transferring diagnostic result data from the device measuring unit to a general-purpose computer.

8. The ancillary equipment according to claim 1, further comprising a plurality of device measuring units each supported on a separate board for performing a test using one or more of the device measuring units.

9. The ancillary equipment according to claim 3, wherein the device measuring unit comprises a program writing port for permitting a program to be written on a Flash-ROM.

10. The ancillary equipment according to claim 1, wherein the device measuring unit comprises a socket for mounting thereon a device to be measured.

11. The ancillary equipment according to claim 1, wherein said control/communication card is configured to receive a diagnostic signal from a general-purpose computer.

12. The ancillary equipment according to claim 1, wherein the control/communication card is configured to transmit an external control signal and the measuring section is operable to such an external control signal.

13. The ancillary equipment according to claim 12, wherein the external control signal is selected from the group consisting of a start signal, a control signal, and a diagnostic signal.

* * * * *